United States Patent

Mohri

[11] Patent Number: 5,982,175
[45] Date of Patent: Nov. 9, 1999

[54] MAGNETIC SENSOR WITH CMOS MULTIVIBRATOR

[75] Inventor: Kaneo Mohri, Nagoya, Japan

[73] Assignee: Japan Science and Technology Corporation, Japan

[21] Appl. No.: 08/870,315

[22] Filed: Jun. 6, 1997

[30] Foreign Application Priority Data

Jun. 11, 1996 [JP] Japan ................................. 8-149427

[51] Int. Cl.$^6$ ........................ G01R 33/02; G01P 3/487; H03K 3/281
[52] U.S. Cl. ................ 324/249; 324/173; 324/207.13; 324/244; 324/260; 331/111
[58] Field of Search .................... 324/173, 174, 324/244, 207.15, 207.13, 252, 249, 260; 331/113 R, 111, 116 FE, 144, 143; 360/110, 113

[56] References Cited

U.S. PATENT DOCUMENTS

| | | | |
|---|---|---|---|
| 3,719,835 | 3/1973 | Eberhard | 307/273 |
| 4,104,619 | 8/1978 | Hesler | 340/629 |
| 4,150,573 | 4/1979 | Iinuma et al. | 73/362 AR |
| 5,134,371 | 7/1992 | Watanabe et al. | 324/252 |
| 5,705,926 | 1/1998 | Senda et al. | 324/207.13 X |
| 5,764,055 | 6/1998 | Kawase | 324/207.13 X |

FOREIGN PATENT DOCUMENTS 181239 7/1995 Japan ................................. 324/260

*Primary Examiner*—Gerard Strecker
*Assistant Examiner*—T. R. Sundaram
*Attorney, Agent, or Firm*—Lorusso & Loud

[57] ABSTRACT

A magnetic sensor includes a DC power source, a multivibrator circuit composed of two CMOS inverters, a resistor, and a capacitor, each of the CMOS inverters being composed of a pMOS transistor and an nMOS transistor connected in series, and a magneto-impedance element. In a transition state attributable to switching operations of the CMOS inverters, a sharp pulse current is caused to flow through the magneto-impedance element so as to excite the magneto-impedance element sufficiently causing the skin effect, whereas in a steady state, the flow of the current is stopped by the CMOS inverters so as to reduce power consumption.

7 Claims, 6 Drawing Sheets triangle localized field (±1mOe, 300Hz)

E-out of field-difference sensor

MAGNETIC SENSOR WITH CMOS MULTIVIBRATOR

BACKGROUND OF THE INVENTION

Field of the Invention

The present invention relates to compact low-power consumption type magnetic sensors having high sensitivity and high response speed. More particularly, the present invention relates to high-performance micro magnetic sensors such as magnetic recording heads for computers and information devices; magnetic sensor heads for rotary encoders; and magnetic sensor heads that are used in factory automation so as to carry out measurement for physical distribution, nondestructive magnetic inspection, etc.

Computers and information devices are required to have drastically increased storage capacity so as to cope with multimedia techniques. Therefore, in the field of magnetic disk memory, there is a rapid movement to replace magnetic heads with magneto-resistance (MR) elements. Another movement is the utilization of a giant magneto-resistance effect (GMR) to obtain a highly sensitive magnetic head, with expectation of realizing a hard disk unit having a storage density of 10 gigabits/square inch by about 2010. In order to obtain a hard disk unit having a storage density greater than 10 gigabits/square inch, a magnetic head having higher sensitivity is needed, and a magneto-impedance (MI) element is a promising candidate for such a magnetic head.

Meanwhile, in the field of industrial instruments/control as well as in the field of measurement related to medicine, the environment, disaster prevention, nondestructive inspection, etc., there is arising a strong demand to detect magnetic fields having a strength of one microgauss to a few gausses within a frequency range of 0 to 10 MHz.

In the European Union, there was introduced in January, 1996 a regulation regarding generation of electromagnetic noise from electronic equipment and exposure thereto, and since then a demand for sensors capable of detecting very weak electromagnetic waves has become stronger.

In order to detect a weak magnetic field or wave within the above-described frequency range, a micro-dimensioned head of a Hall element or MR element can be used. However, the sensitivity of such a head is insufficient. When a flux gate sensor is used for such purpose, sufficient response speed cannot be obtained. The flux gate sensor also has a problem that its sensitivity becomes quite insufficient when formed in a micro-sized head.

To overcome the above-described drawbacks, the inventors of the present invention have proposed an improved magneto-impedance (MI) element (see Japanese Patent Application Laid-Open (kokai) No. 7-181239). A micro-dimensioned head utilizing the improved MI element has a resolution of one microgauss and a high responsiveness of 1 MHz, thereby covering a large portion of the required range for magnetic field detection. The power consumption of the micro-dimensioned head is as low as about 30–50 mW.

Since the above-described MI micro sensor is a high performance sensor having a resolution of one microgauss and a high responsiveness of 1 MHz, it can solve many of the technical problems related to new types of magnetic detection required in many industrial fields.

Accordingly, MR elements, Hall elements, and flux gate sensors, which have been widely used, are expected to be replaced with MI elements in the near future so as to realize more advanced systems.

However, there must be solved many problems related to the replacement of currently used elements with MI elements.

One such problem is difficulty in designing a sensor circuit and stems from the necessity of high-frequency technology. Another problem is power consumption in the case where many MI elements are used.

The former problem has been basically solved through use of a high-frequency oscillation type magnetic head in which the magnetic head is driven by means of a Colpitts oscillation circuit or a multivibrator circuit.

However, it is desired to further decrease the number of components of such an electronic circuit.

The latter problem is minor because the power consumption of a single MI element available at the present is about 30–50 mW, and this is sufficiently low for the element itself. However, when many MI elements are used in, for example, an information device, the maximum allowable power consumption of the MI element is considered to be further decreased (for example, to be less than 1 mW).

In order to solve these problems, the use of field effect transistors (FETs, MOSFETs) in place of bipolar transistors (BPTS) has been considered. However, the above-described problems cannot be solved through simple replacement of BPTs with FETs or MOSFETs, because in general an excitation current of not less than a few milliamperes must be caused to flow through a magnetic body in order to sufficiently utilize the magnetic effect of the magnetic material.

SUMMARY OF THE INVENTION

In view of the foregoing problems, an object of the present invention is to provide a stable and low power consumption magnetic sensor, in which a complementary MOSFET (CMOS) oscillation circuit is used as a sensor circuit so as to sufficiently excite an MI element such as an amorphous wire through use of a sharp pulse current in a transition state of CMOS inverters, while maintaining the excitation current at zero in the remaining period by utilizing the characteristics of the CMOS inverters, which causes no current flow in a steady state.

In order to achieve the above object, the present invention provides a magnetic sensor which includes a DC power source, a multivibrator circuit composed of two CMOS inverters, a resistor, and a capacitor, each of the CMOS inverters being composed of a pMOS transistor and an nMOS transistor connected in series, and a magneto-impedance element (hereinafter referred to as an "MI element"). In a transition state attributable to switching operations of the CMOS inverters, a sharp pulse current is caused to flow through the MI element so as to excite the MI element sufficiently, whereas in a steady state, the flow of the current is stopped by the CMOS inverters so as to reduce power consumption.

Preferably, the multivibrator circuit is of a self-oscillation type. More preferably, the multivibrator circuit is an astable multivibrator circuit.

Preferably, a Schottky barrier diode and a detection circuit are connected to the output terminal of the MI element so as to yield a dc output voltage.

The present invention also provides a magnetic sensor which includes a first multivibrator circuit composed of a first pair of CMOS inverters, a first MI element, a first resistor, and a first capacitor, each of the CMOS inverters being composed of a pMOS transistor and an nMOS transistor connected in series; a second multivibrator circuit composed of a second pair of CMOS inverters, a second MI element, a second resistor, and a second capacitor, each of the CMOS inverters being composed of a pMOS transistor and an nMOS transistor connected in series; and a differential amplifier circuit connected to the first and second multivibrator circuits so as to output a voltage corresponding to the difference between the outputs of the first and second multivibrator circuits.

The magnetic sensor according to the present invention has the following advantages.

(A) Since sharp pulse current produced in the transition state of the CMOS inverters is utilized for excitation of the MI element that causes a skin effect, high speed response can be realized while the power consumption is decreased to an extremely low level. In addition, the magnetic sensor is highly sensitive and very stable.

(B) Since a complementary CMOS oscillating circuit is used as a sensor circuit, a sharp pulse current (5–8 nanoseconds) produced in the transition state of the CMOS inverters flows through the MI element such as an amorphous wire and excites it sufficiently. In the steady state, since no current flows through the CMOS inverters, the power consumption of the MI element can be decreased to a considerably low level of 20 $\mu$W–0.5 mW.

(C) Since the thresholds of the pMOS and nMOS transistors, which constitute each of the CMOS inverters, vary in opposite directions with temperature, the CMOS oscillator formed by the CMOS inverters has a high degree of temperature stability. Moreover, since the MI element is interposed in a power supply line, the MI element does not adversely affect the oscillation. Therefore, a stable sensor circuit can be obtained.

(D) A micro-dimensioned MI element such as an amorphous wire having a diameter equal to or less than 30 microns or an amorphous thin film element formed by means of sputtering can be used as the MI element.

(E) Since the voltage from the MI element that is induced due to pulse current in the transition state of the CMOS inverters also has a sharp pulse-like waveform, the response speed in detecting variations of a magnetic field corresponds to the oscillation frequency of the CMOS multivibrator. Accordingly, a magnetic sensor having a high response speed can be obtained.

(F) It is possible to obtain a high performance micro magnetic sensor which can be operated through use of a battery or through combined use of a compact solar cell and a small battery, and which is therefore portable and is self-reliance in terms of energy.

(G) The CMOS MI sensor consumes a relatively little power, and therefore the amount of heat generated by the sensor itself is very small. Accordingly, the temperature stability of the sensor is very high and the electrical noise generated by the sensor is small, resulting in an improved S/N ratio in detection of a magnetic field.

In many industrial fields such as of computers and information devices, the magnetic sensor of the present invention can be used for detection of weak high-frequency magnetic fields, for accurate detection of a direction or angle, for detection of displacement, velocity, or acceleration in cooperation with a micro magnet.

Pulse magnetization of MI elements is also carried out with differentiation of the rectangular output voltage of the CMOS multivibrator, in which the pulsed voltage is reinforced through an inverter and then applied to the MI elements.

Biasing or setting the operating point of the MI element is carried out applying a dc magnetic field along with the MI element length direction, or applying the same pulse current to a coil set around the MI element through which the pulse current is applied.

DESCRIPTION OF THE PREFERRED EMBODIMENTS

Embodiments of the present invention will now be described in detail with reference to the drawings.

Figure 1A:
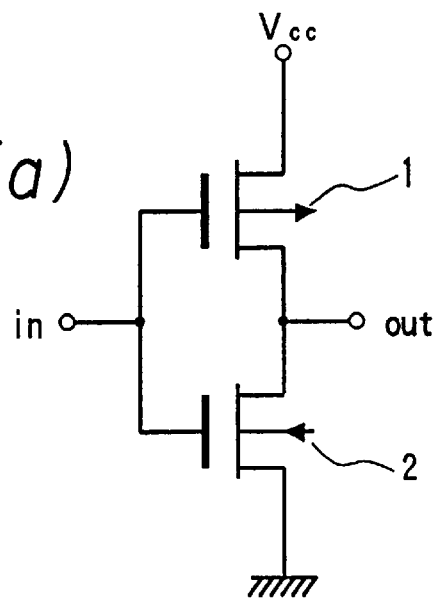
FIGS. 1A–1C are circuit diagrams showing a CMOS MI sensor according to a first embodiment of the present invention.
Figure 1B:
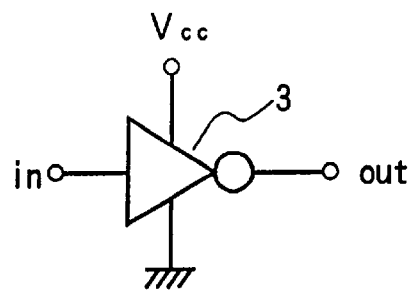
Figure 1C:
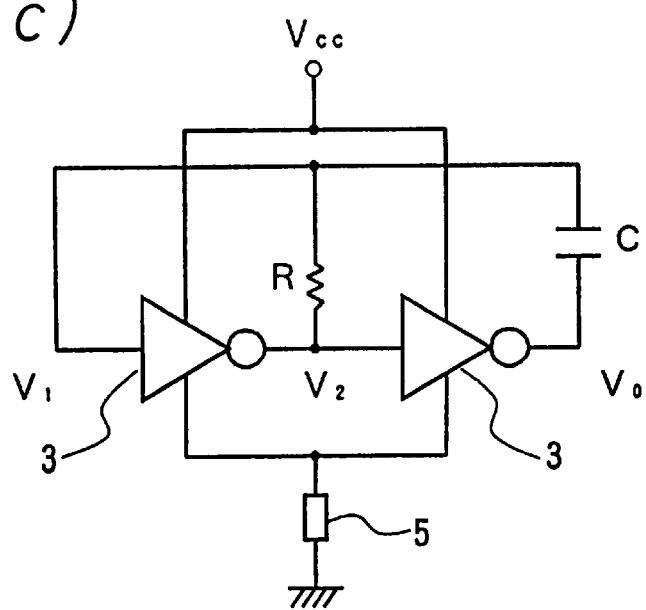

FIGS. 1A–1C show basic circuits that constitute an MI micro sensor that uses a multivibrator oscillation circuit formed of CMOS inverters, wherein FIG. 1A shows a CMOS inverter circuit (a NOT circuit); FIG. 1B shows a gate symbol for NOT logic; and FIG. 1C is a basic circuit of the MI micro sensor in which the inverter shown in FIGS. 1A and 1B is utilized.

As shown in FIG. 1C, there are provided serially connected two CMOS inverters 3, and a resistor R and a capacitor C are connected to the CMOS inverters 3 so as to form a multivibrator circuit. As shown in FIG. 1A, each of the CMOS inverters 3 is composed of a pMOS FET 1 and an nMOS FET 2 connected serially. Also, as shown in FIG. 1C, an MI element 5 is interposed between the CMOS inverters 3 and the ground. The MI element 5 may be interposed between a DC power source $V_{CC}$ and the CMOS inverters 3. In the circuit shown in FIG. 1C, a sharp pulse current having a pulse width of a few nanoseconds flows through the MI element 5 during transition periods when the CMOS inverters 3 turn ON or OFF.

Next, the operation of the circuit will be described more specifically.

In an ordinary oscillating state, when the input voltage $V_1$ of the left-side CMOS inverter 3 and the output voltage $V_O$ of the right-side CMOS inverter 3 are both zero, the output voltage $V_2$ of the left-side CMOS inverter 3 that serves as an input voltage of the right-side CMOS inverter 3 is $V_{CC}$. In contrast, when the input voltage $V_1$ of the left-side CMOS inverter 3 and the output voltage $V_O$ of the right-side CMOS inverter 3 are both $V_{CC}$, the output voltage $V_2$ of the left-side CMOS inverter 3 that serves as an input voltage of the right-side CMOS inverter 3 is zero.

The inverters of the multivibrator circuit perform their switching operations as follows. When the input voltage exceeds a threshold voltage $V_{th}$, the pMOS FET 1 turns OFF while the nMOS FET 2 turns ON (a saturated state). When the input voltage becomes lower than the threshold voltage $V_{th}$, the pMOS FET 1 turns ON (a saturated state) while the nMOS FET 2 turns OFF. The threshold voltage $V_{th}$ is 30–60% of the DC power source voltage $V_{CC}$.

In the multivibrator circuit, immediately after the voltages $V_1$ and $V_0$ become $V_{CC}$ and the voltage $V_2$ becomes zero, current flows from the power source to the ground via the right-side inverter 3, the capacitor C, the resistor R, and the left-side inverter 3, in this order, so that the capacitor C is charged and the voltage $V_1$ decreases from the $V_{CC}$ toward zero at a rate corresponding to the CR time constant. When the voltage $V_1$ reaches the threshold voltage $V_{th}$, the left-side CMOS inverter 3 changes its state so that the voltage $V_2$ becomes $V_{CC}$, and the right-side inverter 3 changes its state so that the voltage $V_0$ becomes zero.

As a result of this switching operation, current flows from the power source to the ground via the left-side inverter 3, the resistor R, the capacitor C, and the right-side inverter 3, in this order, so that the capacitor C is charged in the opposite direction at a rate corresponding to the CR time constant and the voltage $V_1$ increases. When the voltage $V_1$ exceeds the threshold voltage $V_{th}$, the left-side CMOS inverter 3 changes its state so that the voltage $V_2$ becomes zero, and the right-side inverter 3 changes its state so that the voltage $V_0$ becomes $V_{CC}$.

Through repetition of the above described switching operation, the voltage $V_0$ having a square waveform in which voltage changes are repeated between the $V_{CC}$ and zero at a frequency of about $(1/2.2) \cdot CR$. In this CMOS multivibrator circuit, one of the pMOS FET 1 and the nMOS FET 2 is inevitably in the OFF state during a steady state operation between a certain switching operation and a subsequent switching operation of the CMOS inverter 3, and the current flowing from the power source is maintained at zero during such a steady state. When the CMOS inverter 3 carries out a switching operation, the pMOS FET 1 and the nMOS FET 2 both turn ON (an unsaturated state) within a short period of a few nanoseconds, so that a sharp pulse current flows through the CMOS inverter 3.

Since the circuit is designed such that the pulse current flows through MI element 5 such as an amorphous wire, the MI element 5 can exhibit a magneto-impedance effect stemming from the skin effect. At the same time, electrical power is consumed only during a short period of a few nanoseconds within each period of the multivibrator oscillation. Therefore, the power consumption of the micro sensor is extremely low.

As the MI element 5, there can be used a micro-dimensioned MI element disclosed in Japanese Patent Application Laid-Open (kokai) No. 7-181239.

Examples of the MI element 5 include a thin elongated magnetic material, such as amorphous wire, having a diameter of 20–50 $\mu$m, and an amorphous magnetic thin film having a thickness of 1–4 $\mu$m. When a pulse current produced due to transition of the CMOS inverters flows through the MI element 5, the MI element exhibits the skin effect, so that there can be obtained the magneto-impedance effect in which the impedance of the MI element increases sensitively in response to an external magnetic field Hex applied to the magnetic material in the longitudinal direction thereof.

In the steady state in which the CMOS inverter 3 is in the ON or OFF state, no current flows through the CMOS inverter 3; therefore the electrical power consumption is very low. Since the pulse width (5–8 nanoseconds) of the pulse current produced due to transition of the CMOS inverter 3 does not depend on the oscillation frequency f≈0.45/CR, the MI effect or the magnetic field detection sensitivity is substantially constant regardless of the oscillation frequency.

Accordingly, when the oscillation frequency is lowered, the average value of current flowing through the sensor within each oscillation period decreases, so that the power consumption can be decreased without decreasing the magnetic field detection sensitivity.

In the above-described embodiment, a sharp pulse current produced due to transition of the CMOS inverters is applied to the MI element. This makes it a high performance magnetic sensor which has high sensitivity and high response speed and which consumes an extremely small amount of electrical power.

Figure 2:
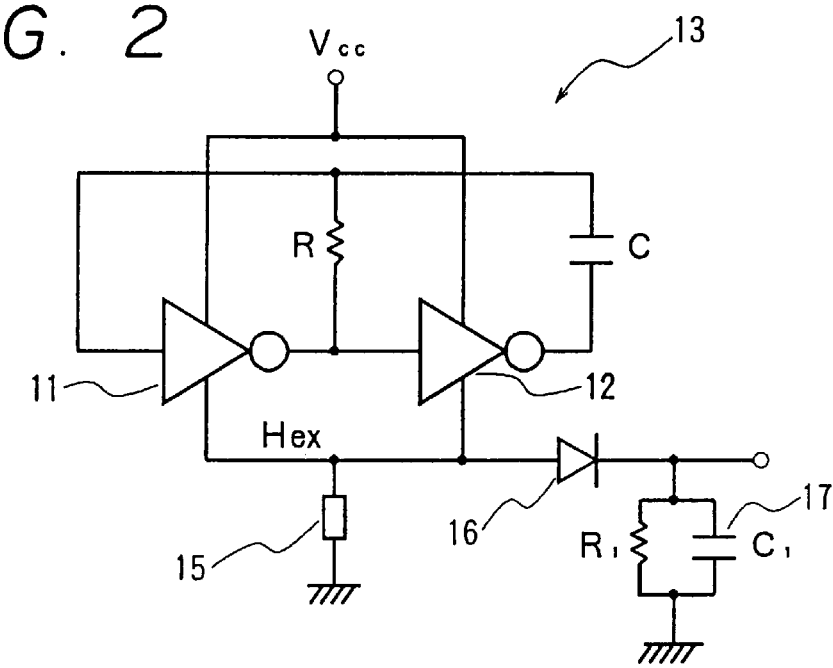
FIG. 2 is a circuit diagram showing a CMOS MI sensor for a rotary encoder according to a second embodiment of the present invention.
Figure 4:
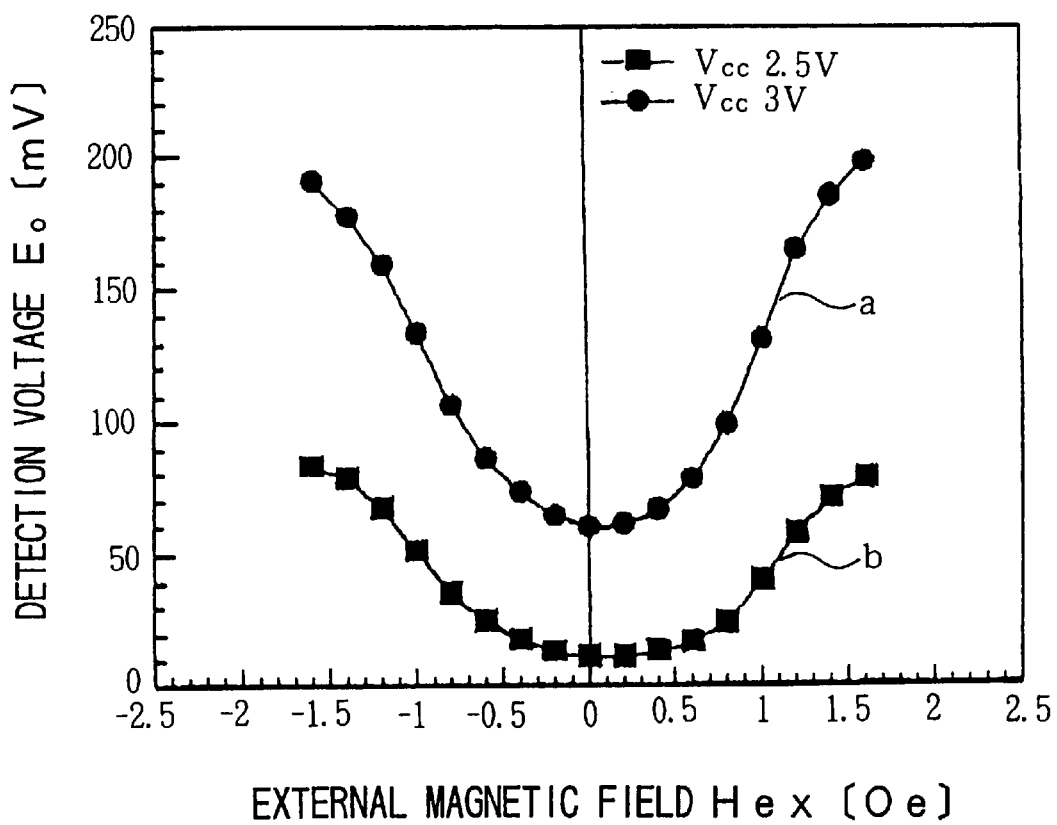
FIG. 4 is a characteristic diagram showing variations of detection voltage Eo with external magnetic field Hex applied to the CMOS MI sensor according to the second embodiment.
Figure 3A:
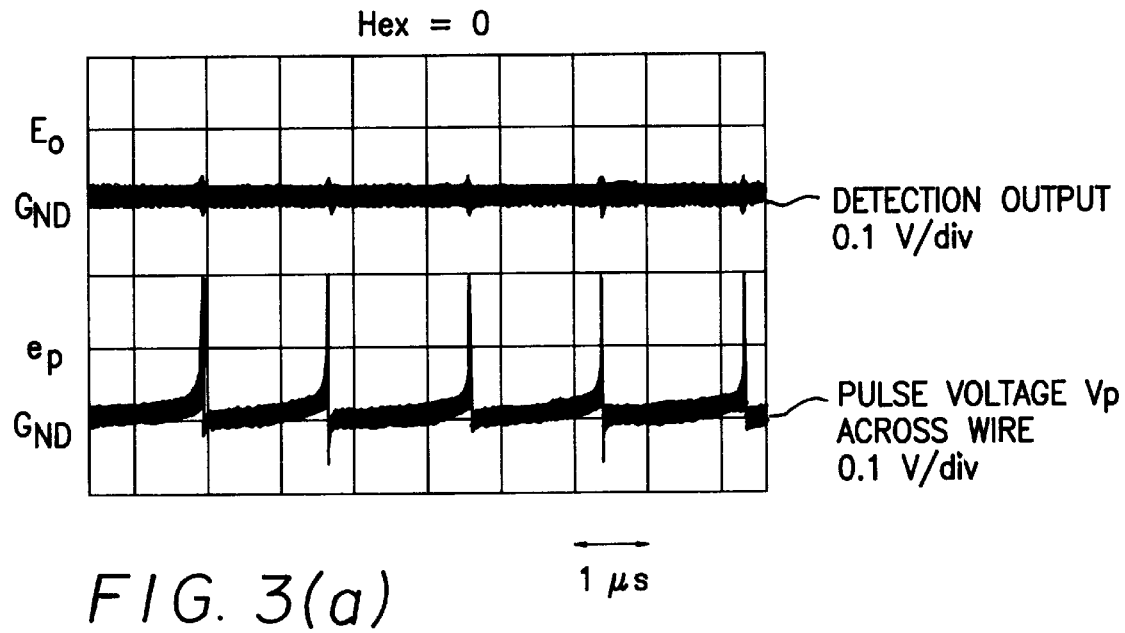
FIGS. 3A and 3B are waveforms showing the output voltage of the CMOS MI sensor according to the second embodiment.
Figure 3B:
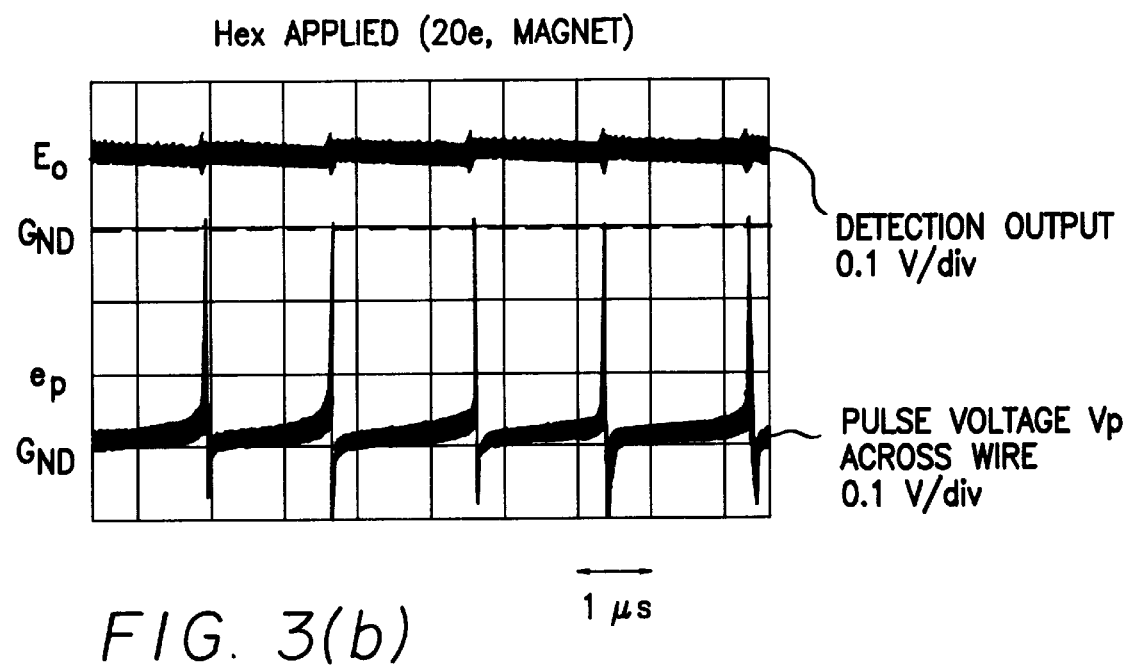

FIG. 2 shows a circuit diagram of a CMOS MI sensor for a rotary encoder according to a second embodiment of the present invention. FIG. 3A shows the output voltage of the CMOS MI sensor in the case where an external magnetic field Hex is zero, and FIG. 3B shows the output voltage of the CMOS MI sensor in the case where an external magnetic field Hex of 2 Oe is applied. FIG. 4 shows variations of detection voltage Eo (mV) with external magnetic field Hex (Oe) applied to the CMOS MI sensor.

As shown in FIG. 2, the CMOS-MI sensor of the present embodiment includes a multivibrator circuit 13, which has the same structure as that of the multivibrator circuit shown in FIG. 1C.

In the present embodiment, there is used a commercially available IC chip that includes six high speed CMOS inverters each having a response time of about 7.5 nanoseconds. Among the six CMOS inverters, two inverters 11 and 12 are used to form the multivibrator circuit 13 in cooperation with a resistor R and a capacitor C. An MI element 15 is interposed between the inverters 11 and 12 and the ground. The MI element 15 is a magnetostriction free amorphous wire having a diameter of 20 $\mu$m and a length of 2 mm. This amorphous wire can be manufactured, for example, by heating an amorphous wire at 470° C. for one minute under a tension of 1 kg/mm$^2$ after cold drawing and by subsequently cooling the amorphous wire.

When the DC power source voltage $V_{CC}$ is 5V, a sharp pulse current having a magnitude of about 20 mA and a half width of about 8 nanoseconds periodically flows through the MI element 15. Due to the skin effect caused by the sharp pulse current, as shown in FIGS. 3A and 3B, the magnitude $V_p$ of the pulse voltage induced across the MI element 15 varies greatly (about 70%/Oe) with an external magnetic field Hex. The Vp varies with increase/decrease of the external magnetic field Hex with almost no hysteresis, because the pulse current can sufficiently excite the amorphous wire in the circumferential direction.

The pulse voltage whose magnitude has been modulated in accordance with the external magnetic field is input to a detection circuit 17 composed of a Schottky barrier diode SBD 16, a resistor $R_1$, and a capacitor $C_1$, in which the peak of the pulse voltage is held so as to output a detection voltage Eo corresponding to the external magnetic field Hex.

The oscillation frequency $f_0$ of the multivibrator circuit 13 is proportional to the DC power source voltage $V_{CC}$ and is represented by $f_0 \approx 0.45/CR$. In the case shown in FIG. 5, the oscillation frequency $f_0$ is about 220 kHz when C=100 pF and R=20 kΩ. When the DC power source voltage is 2.5 V, the average value of the current flowing through the sensor is about 0.19 mA. Therefore, the power consumption is as low as 0.48 mW. The IC that includes the CMOS inverters 11 and 12 is 74AC04, the resistor $R_1$ of the detection circuit 17 has a resistance of 510 kΩ, and the capacitor $C_1$ of the detection circuit 17 has a capacitance of 1000 pF.

When no bias magnetic field is applied to the MI element 15, the detection voltage Eo varies symmetrically with the external magnetic field Hex; i.e., it varies in the same way regardless of the direction of the external magnetic field Hex, as shown in FIG. 4.

Figure 5:
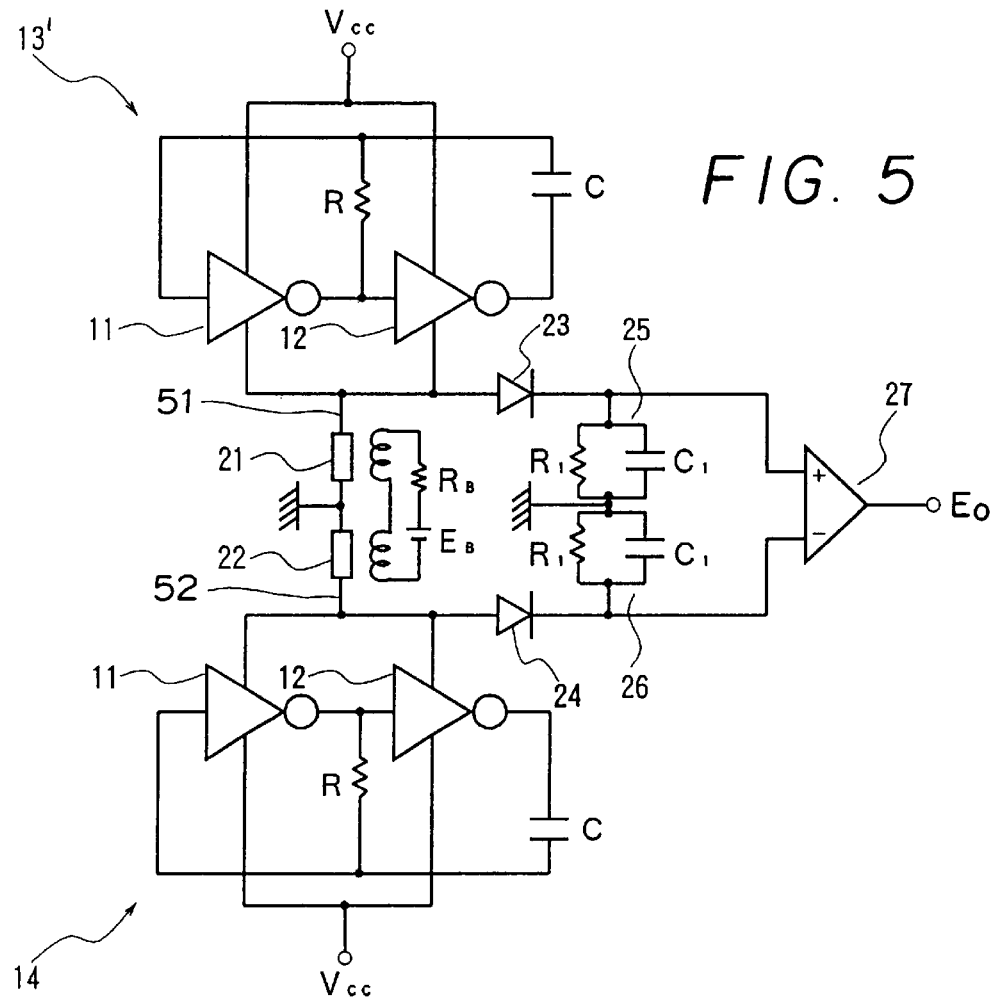
FIG. 5 is a circuit diagram showing a CMOS MI sensor according to a third embodiment of the present invention.
Figure 6:
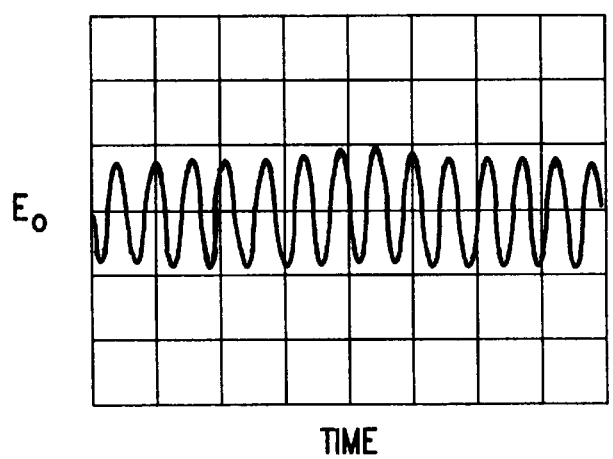
FIG. 6 is a waveform showing output of the CMOS MI sensor according to the third embodiment in which the surface magnetic field of a ring magnet for a rotary encoder is detected by two MI elements, which cancel out the rotor magnetic field of a ring-magnet drive motor.

FIG. 5 shows a circuit diagram of a CMOS MI sensor according to a third embodiment of the present invention. FIG. 6 shows output of the CMOS MI sensor according to the third embodiment in which the surface magnetic field of a ring magnet for a rotary encoder (diameter: 19 mm, number of poles: 100) is detected by two MI elements, which cancel out the rotor magnetic field of a ring-magnet drive motor.

As shown in FIG. 5, the CMOS-MI sensor of the present embodiment is mainly composed of first and second multivibrator circuits 13' and 14 and a differential amplifier 27. Each of the first and second multivibrator circuits 13' and 14 has the same structure as that of the multivibrator circuit shown in FIG. 1C. A first amorphous wire MI element 21 is disposed in a ground line 51 of the multivibrator circuit 13', while a second amorphous wire MI element 22 is disposed in a ground line 52 of the multivibrator circuit 14. Since a DC bias magnetic field is applied to these MI elements 21 and 22 in the same direction, by $E_s$ through $R_s$ a difference in magnetic field between the ground lines 51 and 52 can be detected. The MI elements 21 and 22 are each made of an amorphous wire having a diameter of 20 μm and a length of 1 mm. Numerals 23 and 24 each denote a Schottky barrier diode (SBD), and numerals 25 and 26 each denote a detection circuit composed of a resistor $R_1$ and a capacitor $C_1$. The oscillation frequency $f_0$ of the multivibrator circuits 13' and 14 is about 300 kHz, and the DC power source voltage $V_{CC}$ is 5V.

The values of the components in the drawings are mere examples.

The present invention is not limited to the above-described embodiments. Numerous modifications and variations of the present invention are possible in light of the spirit of the present invention, and they are not excluded from the scope of the present invention.

Figure 7:
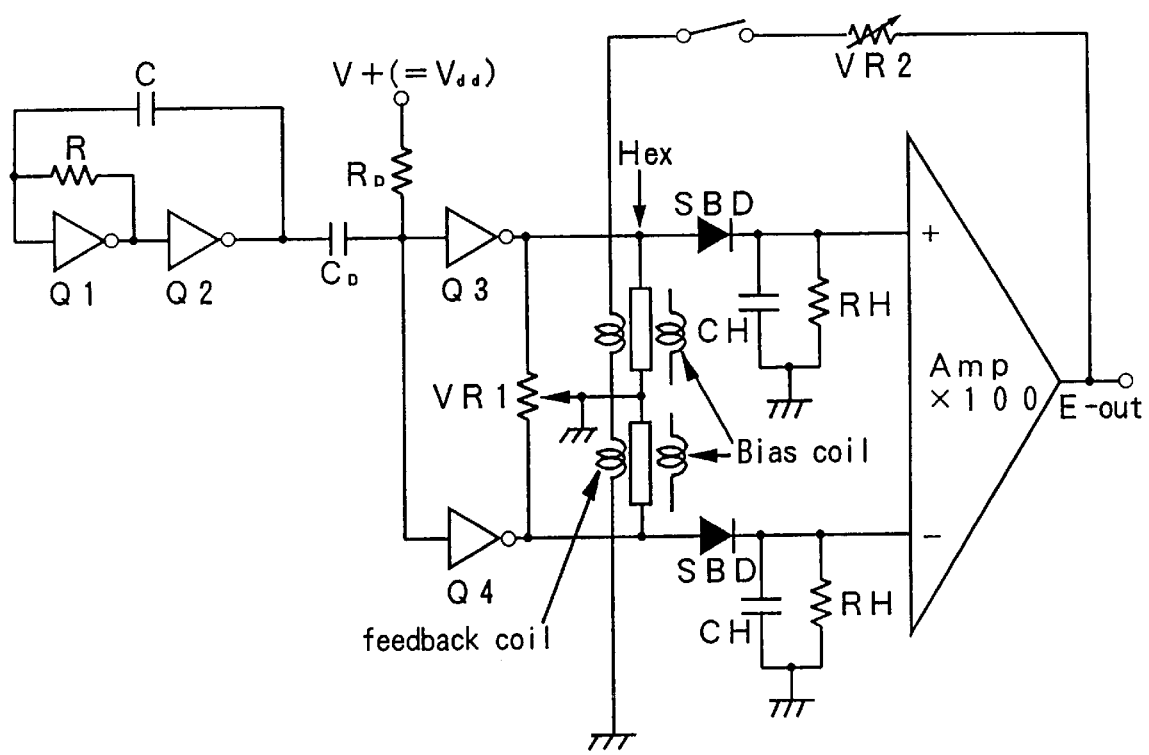
FIG. 7 is a circuit diagram showing a CMOS IC amorphous-wire head MI magnetic sensor according to a fourth embodiment of the present invention.

For example, instead of utilizing the pulse current flowing through the power line, there can be used a pulse voltage that is obtained by differentiating a square-wave voltage output from the multivibrator through use of a differentiating circuit, as shown in FIG. 7.

In FIG. 7. $R_D$ and $C_D$ form the differentiator. The pulsed voltage is reinforced or amplified through another inverter Q3 or Q4 and then applied to each MI element. As an example, Q1, Q2, Q3 and Q4 are C-MOS inverters in a 74AC04 chip; C=100 pF; R=20 kΩ; $C_D$=100 pF; $R_D$=200 Ω; VR1=200 Ω; VR2=1 kΩ; SBD is a 1SS97 chip; CH=2000 pF; and RH=51 kΩ.

Figure 8:
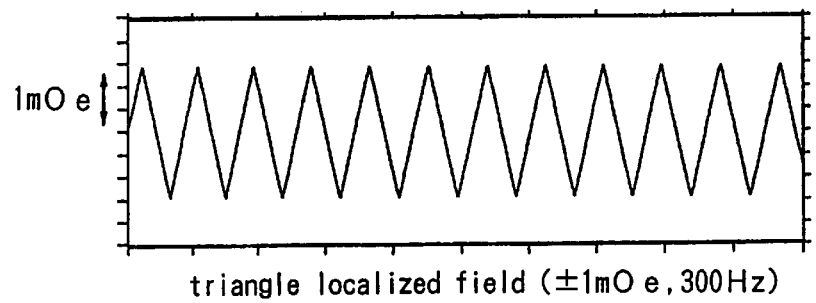
FIG. 8 is a waveform showing the triangle localized field in field detection at difference type MI sensor.
Figure 9:
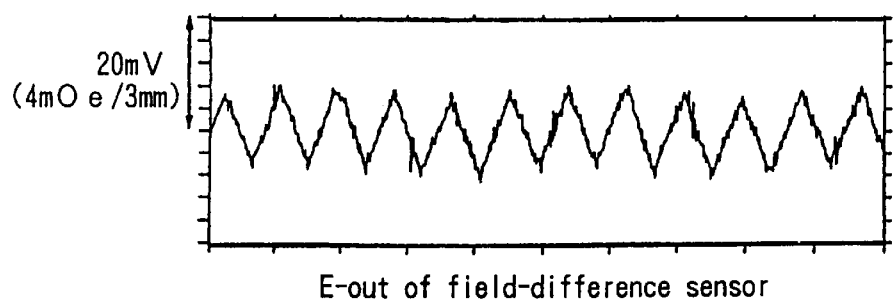
FIG. 9 is a waveform showing the E-out in the in field detection at difference type MI sensor.
Figure 10:
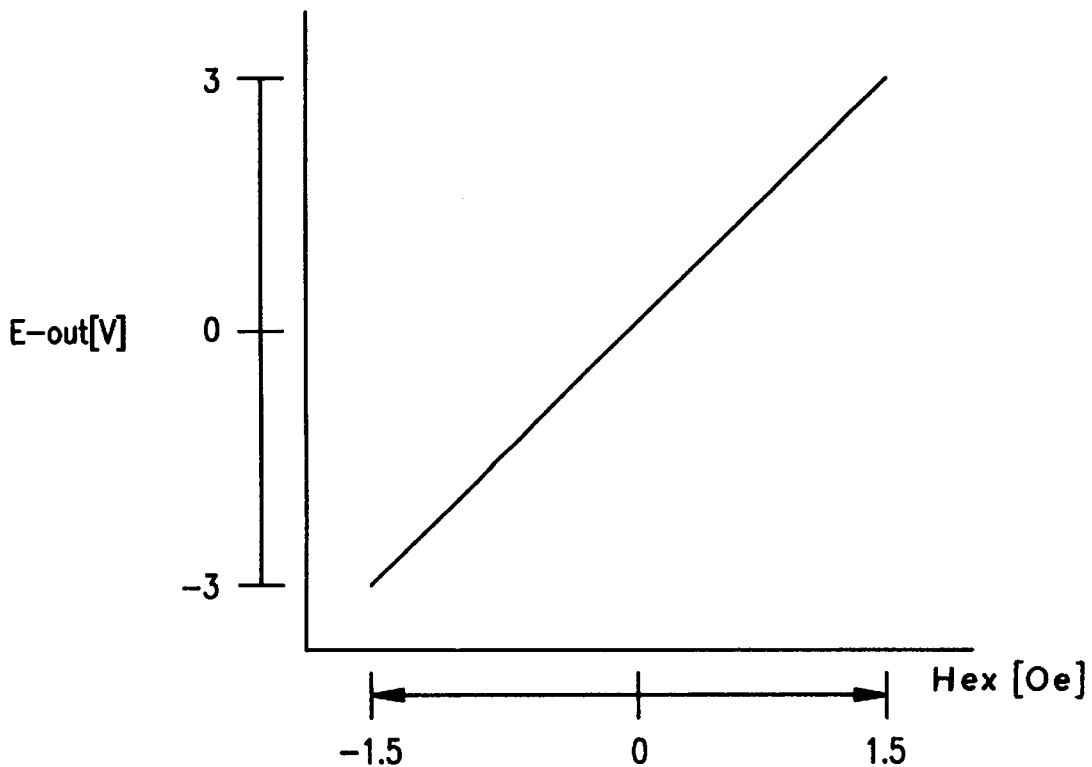
FIG. 10 is a graph showing the field detection characteristics of the MI sensor using negative feedback loop at absolute field detection type MI sensor.

FIG. 8 is a waveform showing the triangle localized field in field detection at difference type MI sensor; FIG. 9 is a waveform showing the E-out in the in field detection at difference type MI sensor; and FIG. 10 is a graph showing the field detection characteristics of the MI sensor using negative feedback loop at absolute field detection type MI sensor.

What is claimed is:

1. A magnetic sensor comprising:

(a) a DC power source;

(b) a multivibrator circuit including two CMOS inverters, a resistor and a capacitor interconnected to form the multivibrator circuit, each of said CMOS inverters being composed of a pMOS transistor and a nMOS transistor connected in series across the power source; and (c) a magneto-impedance element connected in series with the power source and at least one of said inverters, whereby (d) in a transition state during a switching operation of said CMOS inverters, a pulse current is caused to flow through said magneto-impedance element so as to produce a skin effect in said magneto-impedance element, and during a steady state, the flow of the current is stopped by said CMOS inverters so as to reduce power consumption.

2. A magnetic sensor according to claim 1, wherein said multivibrator circuit is of a self-oscillation type.

3. A magnetic sensor according to claim 2, wherein said multivibrator circuit is an astable multivibrator circuit.

4. A magnetic sensor according to claim 1, wherein a Schottky barrier diode forming a detection circuit is connected to an output terminal of said magneto-impedance element so as to yield a DC output voltage.

5. A magnetic sensor comprising:

a DC power source;

a first multivibrator circuit including a first pair of CMOS inverters, a first resistor and a first capacitor interconnected to form the first multivibrator circuit, each of said first pair of CMOS inverters being composed of a pMOS transistor and an nMOS transistor connected in series across the DC power source;

a first magneto-impedance element connected in series with the DC power source and at least one of the first pair of CMOS inverters;

a second multivibrator circuit including a second pair of CMOS inverters, a second resistor and a second capacitor interconnected to form the second multivibrator circuit, each of said second pair of CMOS inverters being composed of a pMOS transistor and an nMOS transistor connected in series;

a second magneto-impedance element connected in series with the DC power source and at least one of the second pair of CMOS inverters;

a biasing circuit for the first and second magneto-impedance elements; and a differential amplifier circuit connected to said first and second magneto-impedance elements so as to output a voltage corresponding to the difference between the outputs of said first and second multivibrator circuits.

6. A magnetic sensor comprising:

a multivibrator circuit including a pair of CMOS inverters interconnected to form the multivibrator circuit;

a differentiating circuit including a resistor, a capacitor, a third CMOS inverter and a fourth CMOS inverter;

a first magneto-impedance element connected to an output of said third CMOS inverter;

a second magneto-impedance element connected to an output of said fourth CMOS inverter;

biasing means for said first and second magneto-impedance elements;

a first Schottky-barrier diode connected to an output of said first magneto-impedance element;

a second Schottky-barrier diode connected to an output of said second magneto-impedance element; and a differential amplifier circuit connected to outputs of said first and second Schottky-barrier diodes so as to output a voltage corresponding to the difference between detected DC voltages of said first and second magneto-impedance elements.

7. A magnetic sensor according to claim 6, wherein said biasing means comprises a biasing circuit including a coil disposed around each of said first and second magneto-impedance elements through which said differentiating circuit applies a pulse current producing a skin effect.

* * * * *